United States Patent [19]

Su

[11] Patent Number: 5,786,735
[45] Date of Patent: Jul. 28, 1998

[54] PHASE AND MAGNITUDE COMPENSATED TUNING FOR SUPPRESSION OF VIBRATION INDUCED PHASE NOISE OF CRYSTAL OSCILLATOR WITH VARYING VIBRATION FREQUENCIES

[75] Inventor: Wei Su, Staten Island, N.Y.

[73] Assignee: The United States of America as represented by the Secretary of the Army, Washington, D.C.

[21] Appl. No.: 805,189

[22] Filed: Feb. 27, 1997

[51] Int. Cl.$^6$ .................................................. H03B 5/04
[52] U.S. Cl. ............................ 331/158; 331/10; 331/175
[58] Field of Search ............................ 331/158, 10, 175, 331/65, 116 R

[56] References Cited

U.S. PATENT DOCUMENTS

| | | | |
|---|---|---|---|
| 4,891,611 | 1/1990 | Frerking | 331/158 |
| 5,185,585 | 2/1993 | Newell et al. | 331/158 |
| 5,659,271 | 8/1997 | Tanabe | 331/158 |

*Primary Examiner*—Son T. Dinh
*Attorney, Agent, or Firm*—Michael Zelenka; George B. Tereschuk

[57] ABSTRACT

The present invention provides an adaptive signal conditioning device for a VCXO crystal oscillator comprising a means for sensing acceleration, a band filter and a means for magnitude and phase compensation, with the means for magnitude and phase compensation having and an analog circuit represented by a transfer function, H(s), which adjusts a tuning signal's magnitude and phase, according to specific vibration frequency ranges, and produces a vibration cancellation signal in the presence of varying vibration frequencies, matching the vibration cancellation signal's frequency response to the frequency response of unwanted vibration-induced phase noise. The desired magnitude and phase of the tuning signal are determined with an adjustable identification device that is vibrated. Also disclosed and claimed is an adaptive signal magnitude and phase compensated tuning method comprising a signal filtering step, a magnitude and phase compensation step and a vibration cancellation signal matching step, in order to match a vibration cancellation signal's frequency response to the frequency response of unwanted vibration-induced phase noise and to suppress vibration-induced phase noise. In the method, the desired magnitude and phase are also determined with an adjustable identification device that is vibrated.

23 Claims, 5 Drawing Sheets

# PHASE AND MAGNITUDE COMPENSATED TUNING FOR SUPPRESSION OF VIBRATION INDUCED PHASE NOISE OF CRYSTAL OSCILLATOR WITH VARYING VIBRATION FREQUENCIES

GOVERNMENT INTEREST

The invention described herein may be manufactured, used and licensed by or for the Government of the United States of America without the payment to me of any royalties thereon.

BACKGROUND OF THE INVENTION

1. Field of the Invention

The present invention relates in general to the field of quartz crystal oscillators and more particularly to devices and methods of magnitude and phase compensated tuning to suppress vibration-induced phase noise of quartz crystal oscillators with varying vibration frequencies.

2. Description of the Prior Art

Vibration effect in frequency sources is known in numerous applications such as Doppler radars, missiles, helicopters, tanks and satellites. The quartz crystal resonator is usually the most vibration-sensitive component in these frequency sources. For this reason, the noise induced by mechanical vibration of the quartz crystal can unfavorably dominate noise from an electronic system's other combined noise sources. Several research approaches have sought to minimize the unwanted vibration sensitivity effect The mechanical approach for minimizing vibration sensitivity involves either a special mounting assembly for the crystal to absorb vibration, or mounting two crystals together to compensate for vibration. The electrical approach for minimizing vibration sensitivity utilizes polarization-effect tuning techniques. Polarization-effect tuning is a method which applies an electrical signal to electrodes of a crystal resonator to form a vibration cancellation signal which cancels, or eliminates, vibration-induced noise of a crystal oscillator's output so that the mechanical vibration has less effect on the output frequency of the crystal oscillator. One drawback to the electrical approach is that the cancellation of vibration noise is unsatisfactory because the frequency response, i.e. magnitude and phase vs. vibration frequency of the vibration cancellation signal differs from the frequency response of the vibration-induced phase noise. Further, the desired magnitude and phase values will vary with the vibration frequency, and to cancel the vibration-induced phase noise in varying vibration frequency, both the magnitude and phase of the tuning signal must be adaptively adjusted to desired values based on the vibration frequency.

Frerking, *Vibration Compensated Crystal Oscillator*, U.S. Pat. No. 4,891,611, issued on Jan. 2, 1990, described using an adaptive filter in a polarization-effect tuning method to minimize a Voltage Controlled Crystal Oscillator's (VCXO) vibration-induced phase noise. This method requires a number of components, including an analog-digital converter, a digital adaptive signal processor, a digital-analog converter, a digital storage (RAM), an adaptive algorithm and a reference oscillator, not subject to vibration, for an external reference signal. In this method, when the external signal is applied, the tap weights of the adaptive filter will be adjusted by the adaptive algorithm depending upon the vibration frequency. Practically, however, an external signal is unavailable and the digital signal processor operates with the fixed tap weights so that it is no longer adaptive to the vibration frequency range. Additionally, that method requires a number of cumbersome and relatively costly components.

V. R. Rossati et. al., "Reduction of the Effects of Vibration on SC-cut Quartz Crystal Oscillators." *Proceedings of the 35th Annual Frequency Control Symposium*, pp. 117-121 (May 1981) and V. R. Rossati, "Suppression of Vibration-Induced Phase Noise in Crystal Oscillators: An Update," *41st Annual Frequency Control Symposium*, pp. 409-412 (May 1987) proposed using an analog amplifier with a fixed gain and no phase delay. In this approach, the tuning signal generated by an accelerometer is modified by a fixed gain null phase linear circuit. Since the gain of the amplifier is calibrated to a single vibration frequency, the magnitude of the tuning signal in that proposed method is not adaptive to vibration frequency change. Another drawback with this method is that the phase of the tuning signal is not adjustable. Taken together, these limitations result in limited satisfactory vibration suppression at only a single frequency point where the phase difference between the tuning signal and the vibration noise in only (2N+1)×180°. Therefore, the drawbacks, shortcomings and limitations of current polarization-effect tuning methods to minimize vibration sensitivity include (i) the inability to adaptively adjust both magnitude and the phase of the tuning signal based on vibration frequency change and (ii) no capability to suppress vibration-induced noise with a varying vibration frequency. The devices and methods of the present invention have solved these long-standing limitations of the prior art techniques.

In order to resolve the long-standing limitations of current polarization-effect tuning methods that neither adaptively adjust the magnitude and the phase of the tuning signal based on vibration frequency change nor suppress vibration-induced noise in a varying vibration frequency, the devices and methods of the present invention provide a simple, inexpensive and adaptive analog signal conditioner device having a compensating means to adjust magnitude and phase of the tuning signal according to the vibration frequency. The compensating means compensates magnitude, or gain, and phase to provide both varying magnitude and varying phase to the tuning signal at specific vibration frequency ranges making that the frequency response of the vibration cancellation signal match the frequency response of vibration-induced phase noise. The present invention also provides the advantages of allowing vibration suppression that is adaptive and effective despite a varying vibration frequency. Further, the devices and methods of the present invention can be implemented simply and inexpensively, without the cumbersome and bulky digital devices such as analog-digital converter, digital adaptive signal processor, digital-analog converter, and RAM of one prior art approach.

SUMMARY OF THE INVENTION

Accordingly, it is an object of the present invention to provide an adaptive signal conditioner device having a means for compensating magnitude and phase to adjust the magnitude and phase of a tuning signal based on vibration frequency in the given frequency range which provides adaptive and effective vibration suppression despite a varying vibration frequency.

It is yet another object of the present invention to provide an adaptive signal conditioned tuning method employing a signal filtering step, a compensating step to adjust the magnitude and phase of the tuning signal based on vibration frequency and a matching step which provides adaptive and effective vibration suppression despite a varying vibration frequency.

To attain these and other objects and advantages of the present invention, an adaptive signal conditioning device for a quartz crystal VCXO oscillator is provided comprising a means for magnitude and phase compensation, having a band filter cascading and an analog circuit represented by a transfer function, H(s), which adjusts the tuning signal's magnitude and phase, in a specific vibration frequency range, and produces a vibration cancellation signal in the presence of a varying vibration frequency, that matches the vibration cancellation signal's frequency response to the frequency response of unwanted vibration-induced phase noise. Also disclosed and claimed is an adaptive signal magnitude and phase compensated tuning method comprising a signal filtering step, a magnitude and phase compensation step and a vibration cancellation signal matching step, in order to match a vibration cancellation signal's frequency response to the frequency response of unwanted vibration-induced phase noise and to suppress vibration-induced phase noise.

DETAILED DESCRIPTION OF THE INVENTION

As described in the Background of the Invention those concerned with polarization-effect tuning techniques in quartz crystal oscillators have long recognized the need to adaptively adjust the magnitude and the phase of the tuning signal based on vibration frequency change and suppress vibration-induced phase noise in the given vibration frequency range, without suffering from any of the shortcomings, drawbacks and limitations of prior art devices and methods.

Figure 1:
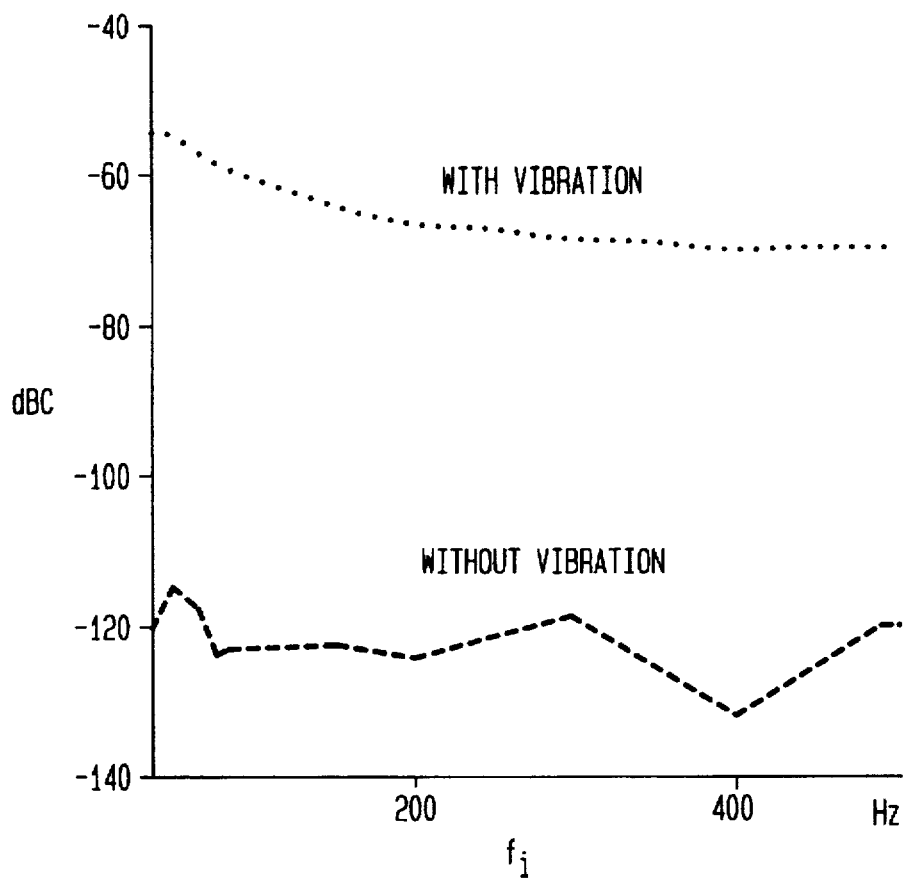
FIG. 1 depicts a plot of vibration-induced phase noise vs. the vibration frequency.
Figure 2:
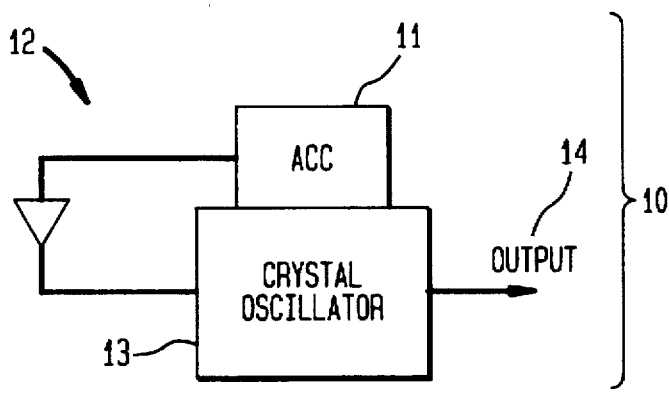
FIG. 2 is a block diagram showing the principle of polarization-effect tuning.

Referring now to the drawings, FIG. 1 is a chart depicting a plot of vibration-induced phase noise vs. the vibration frequency. The lower "without vibration" curve is a region of phase noise present when quartz crystal oscillators operate in ideal, vibration-free environments, while the upper "with vibration" curve represents a region of phase noise, or vibration sideband, present when those oscillators are subjected to a 10 gPK sinusoidal waveform mechanical vibration in multiple frequencies between 40 Hz and 500 Hz. FIG. 1 indicates that vibration sensitivity decays with the vibrating frequency. FIG. 2 is a block diagram showing the principle of polarization-effect in a tuning device 10. In this diagram, a means for acceleration sensing 11 senses mechanical vibration, and generates an output 12 which is fed directly to a Voltage Controlled Crystal Oscillator (VCXO) 13, through its electrodes, resulting in a signal output 14.

The polarization-effect illustrated by FIG. 2, is defined as the change in resonant frequency of piezoelectric resonators due to an impressed electric field. The frequency change is a highly linear function of the applied voltage. If the voltage is a sinusoidal waveform: $A_v \sin(2\pi ft+\theta_v)$, sidebands at f will occur above and below the carrier frequency as if the quartz crystal resonator were under mechanical vibration at the frequency f. Since the polarization-effect and mechanical vibration give the same effect in a quartz crystal oscillator's output, both signals will be nulled at the output if and only if (i) the magnitude of both signals are identical at f, and (ii) the phase difference between the two signals is $(2N+1) \times 180°$, $N=0, 1, 2, \ldots$, at f. The concept of polarization-effect tuning is to tune magnitude, $A_v$, and the phase, $\theta_v$, of the applied voltage to satisfy cancellation conditions (i) and (ii) simultaneously. When vibration cancellation is required in a vibration frequency range, $f \in \{f_{low}, f_{high}\}$, a signal conditioner provides the capability to adaptively adjust the tuning signal.

Figure 3:
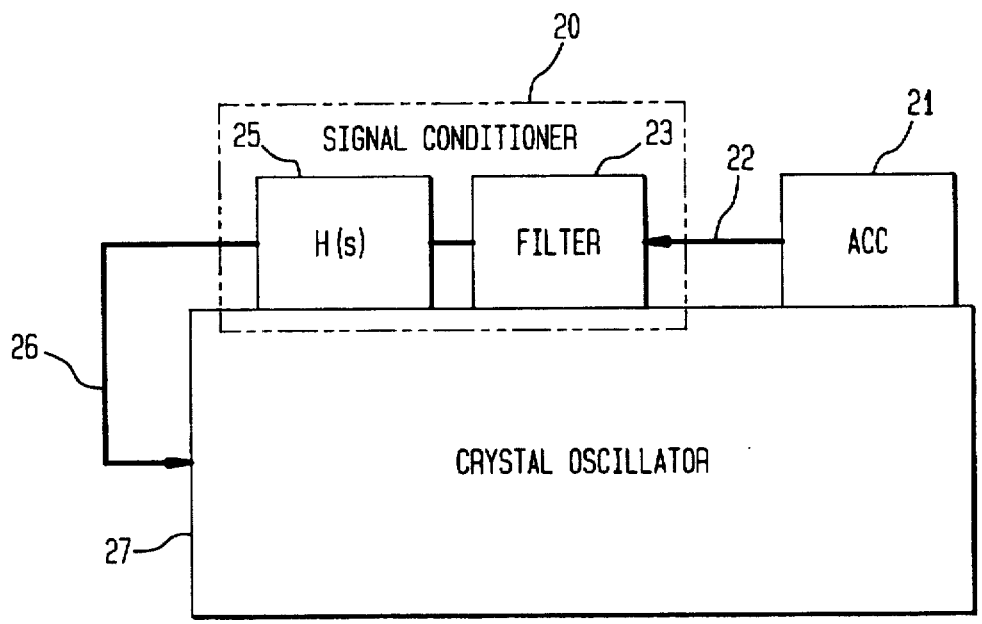
FIG. 3 is a block diagram depicting the preferred embodiment of the device of the present invention.
Figure 4:
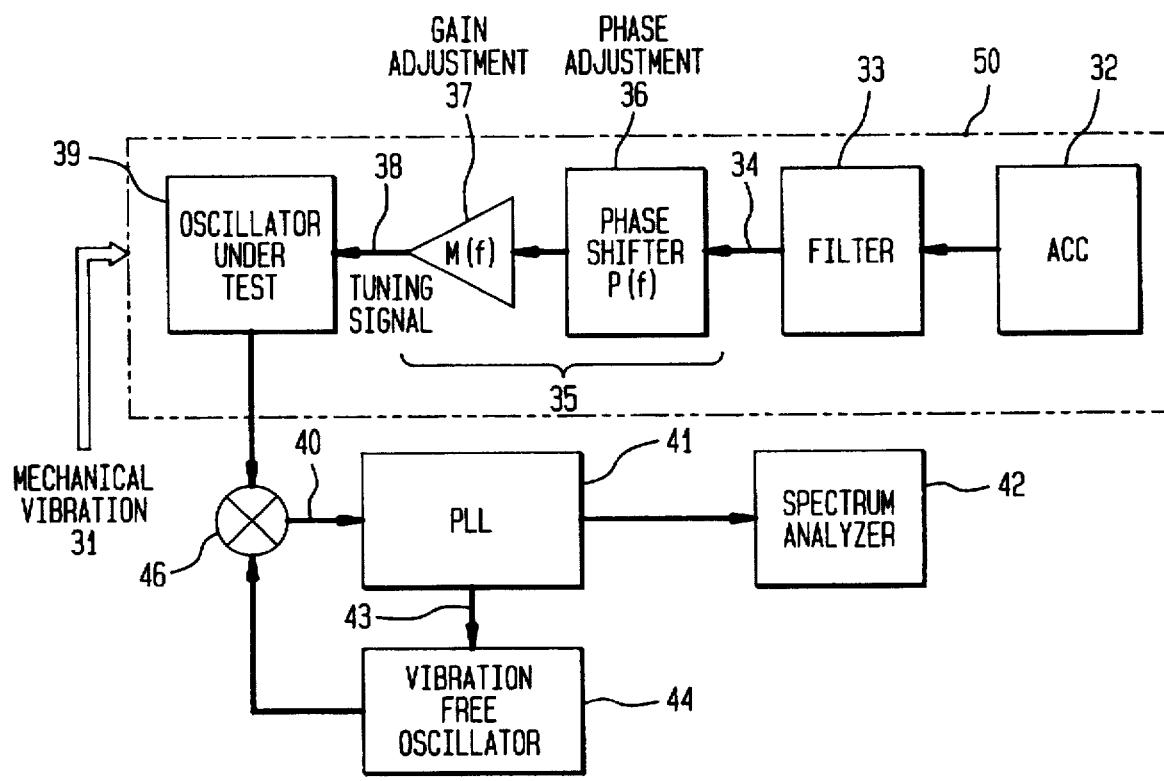
FIG. 4 is a block diagram depicting vibration testing of the preferred embodiment of the present invention to identify the transfer function, H(s).

In order to achieve the desired magnitude and phase of a vibration cancellation signal, an adaptive signal conditioner is needed to adjust the tuning signal. As shown in FIG. 3, the signal conditioning device of the present invention provides a means for compensating magnitude and phase, having an analog circuit represented by a transfer function H(s), to add the desired additional magnitude and the additional phase to the tuning signal. This invention's compensating means is inserted into the tuning path in order to satisfy cancellation conditions (i) and (ii) simultaneously over frequency range $f \in \{f_{low}, f_{high}\}$. FIG. 4 illustrates an identification device represented by transfer functions M(f) and P(f) used for determining the desired transfer function, H(s), in FIG. 3 that provide the vibration cancellation signal needed to suppress vibration-induced phase noise.

The FIG. 3 block diagram shows the preferred embodiment of present invention's signal conditioning device 20. Similar to the FIG. 2 arrangement, a means for sensing acceleration 21 provides an output 22, having given magnitude and phase characteristics, which is later transmitted to a Voltage Controlled Crystal Oscillator (VCXO) 27, after being compensated by a signal conditioner 20, represented on the drawing by the dashed rectangle. Said signal conditioner 20 is an analog device, further comprising a band filter 23 coupled to a means for compensating magnitude and phase 25, having an analog circuit represented by a transfer function, H(s), which compensates the magnitude and phase characteristics of said output 22. In accordance with the present invention, said compensating means 25 adds both varying magnitude and varying phase to said output 22, producing an adaptive tuning signal 26, which is essentially a vibration cancellation signal that corrects the nonlinear distortion of said acceleration sensing means 21 and a tuner's phase delay. Said signal conditioner 20 sends said adaptive tuning signal 26 to said VCXO 27. The present invention's arrangement includes both an acceleration sensing means and a VCXO, however, unlike the FIG. 2 arrangement, in the present invention, said compensation means 25 inserted into the tuning path compensates the magnitude and phase of said output 22, to provide both variable magnitude and phase, which can be determined in accordance with FIG. 4, to said output 22 at given vibration frequency ranges, so that the frequency response of the vibration cancellation signal matches the frequency response of vibration-induced phase noise. As a result, the cancellation signal cancels the vibration-induced phase noise. The signal conditioner 20 encompasses all analog circuits, including both the linear and non-linear type, and can be integrated with the VCXO. Said acceleration sensing means 21 can be any electrical or electronic device able to sense mechanical vibration, such as one or more accelerometers, with three dimensional vibration compensation being provided when at least three accelerometers are utilized. Said band filter 23 can be a wide-band filter.

FIG. 4 illustrates vibration-testing a second signal conditioner 50 to obtain the desired magnitude, M*(f), and the desired phase, P*(f), for said signal conditioner 20 in the laboratory by mounting a means for sensing acceleration, said second signal conditioner 50 and a test oscillator on a vibration platform 31. In FIG. 4, the second signal conditioner 50, which is depicted within the dashed rectangle, is deployed on the vibration platform 31, and the other components are laboratory test devices for setting desired parameters of the signal conditioner 20, which then are no longer needed for operation of the signal conditioner 20. In this arrangement, said means for sensing acceleration 32 is coupled to a band filter 33 which provides an output 34 to a means for compensating 35. Said band filter 33 cuts off frequencies outside of the working range and cascades with a linear analog circuit within said means for compensating 35. Said means for compensating 35 is broken down into its two main components: a means for phase adjustment 36, designated as P(f), and a means for gain adjustment 37, designated as M(f), which are connected to each other and can be separately adjusted. Said compensating means 35, provides a tuning signal 38 to a test VCXO oscillator 39. Said vibration table 31 generates a given mechanical vibration in a sinusoidal waveform in said test VCXO oscillator 39. A VCXO output is fed through a multiplier 46 to a phase lock loop 41 includes a plurality of vibration-induced noise waveforms 40 which, in turn, are observed on a spectrum analyzer 42, so that an operator can adjust said means for phase adjustment 36, P(f), and said means for gain adjustment 37, M(f), to cancel said vibration-induced phase noise waveforms 40. The desired magnitude, M*(f), and desired phase, P*(f) at vibration frequency f will be obtained when the vibration noise is minimized by adjusting said means for phase adjustment 36, P(f), and said means for gain adjustment 37, M(f). Following these matching adjustments, said phase lock loop 41 provides an adjusted tuning signal 43 to a vibration free VCXO oscillator 44. These matching adjustments can either be made manually or automatically.

In operation, said signal conditioner 20 requires an analog circuit with the compensating means 25 having a transfer function H(s) whose magnitude |H(f)| and phase ∠H(f) match the desired magnitude, M*(f), and the desired phase, P*(f), in a given vibration frequency range. This is expressed mathematically as:

$$|H(f)| = M^*(f)$$
$$\angle H(f) = P^*(f)$$
$$f \in \{f_{low}, f_{high}\}$$

In this case, both cancellation conditions (i) and (ii) are satisfied, and the vibration-induced phase noise waveforms 40 will be eliminated at $f \in \{f_{low}, f_{high}\}$. A number of variations of this preferred embodiment are possible by choosing various analog circuits H(s).

In a comparative test, a prior art fixed gain null phase network and an adaptive signal conditioner, similar to the preferred embodiment, were both mounted on a shaker table and subjected to the same 10 gPK sinusoidal waveform vibration between 40 Hz and 500 Hz. Utilizing a FIG. 4—type test arrangement to measure the desired magnitude, *M(f), and desired phase, *P(f). The FIG. 7 chart shows the magnitude curve of the second-order signal conditioner matching the desired magnitude of the tuning signal vs. the vibration frequencies, where the squares represent the desired magnitude, *M(f). The second-order linear circuit used for matching *M(f) and *P(f) are described by the following transfer function:

$$H(s) = \frac{\left(1 + \frac{s}{12}\right)\left(1 + \frac{s}{400}\right)}{\left(1 + \frac{s}{6}\right)\left(1 + \frac{s}{1260}\right)}$$

Figure 8:
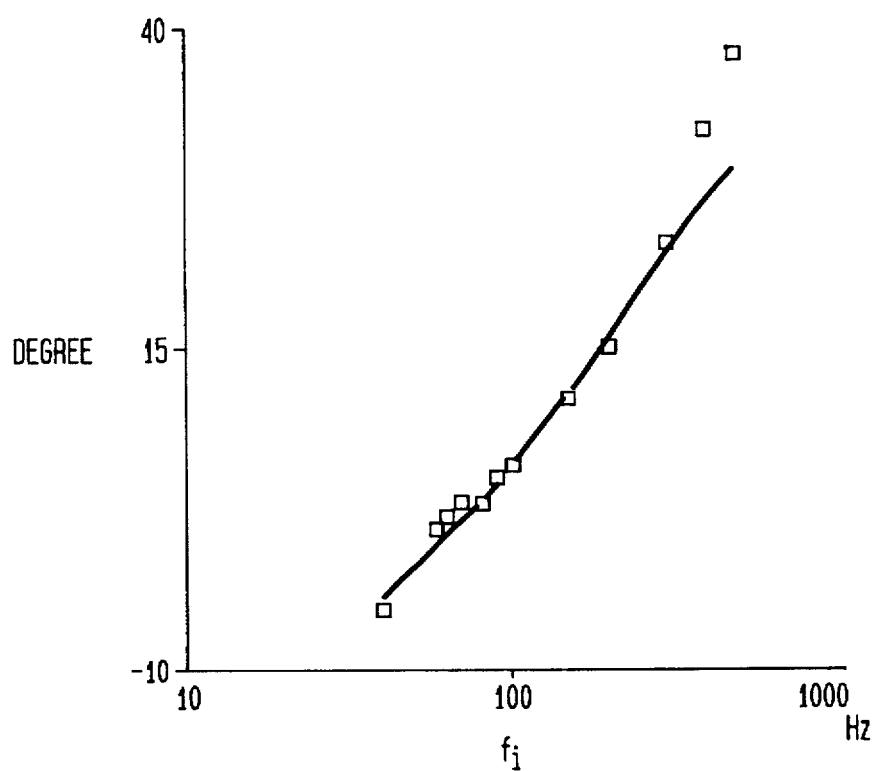
FIG. 8 is a chart depicting the phase curve of a second-order signal conditioner linear circuit matching the desired phase of the tuning signal vs. the vibration frequencies.

FIG. 8 is a chart depicting the phase curve of the second-order transfer function H(s) matching the desired phase of the tuning signal vs. the vibration frequencies, with the squares representing the desired phase, *P(f). The FIGS. 9 and 10 charts display the results of this comparative test by using a linear second-order transfer function H(s) in a FIG. 3—type arrangement where the middle-dashed curve represents the vibration-induced phase noise with the prior art non-adaptive vibration cancellation techniques. The present invention's signal conditioner demonstrated far superior cancellation signal matching and noise suppression. In most vibration frequencies, the prior art non-adaptive techniques achieve vibration-suppression of less than −20 dB due to mismatches of both magnitude and phase between the compensation signal and the vibration noise. For this reason, the prior art cancellation techniques are only effective, in this case, at the single vibration frequency at 50 Hz.

Figure 7:
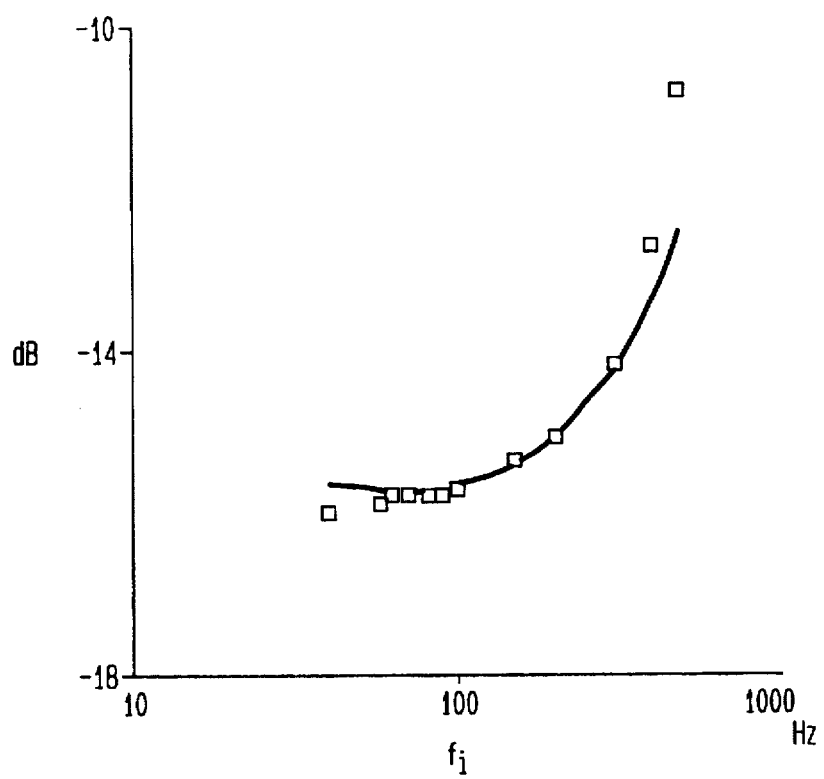
FIG. 7 is a chart depicting the magnitude curve of a second-order signal conditioner linear circuit matching the desired magnitude of the tuning signal vs. the vibration frequencies.
Figure 9:
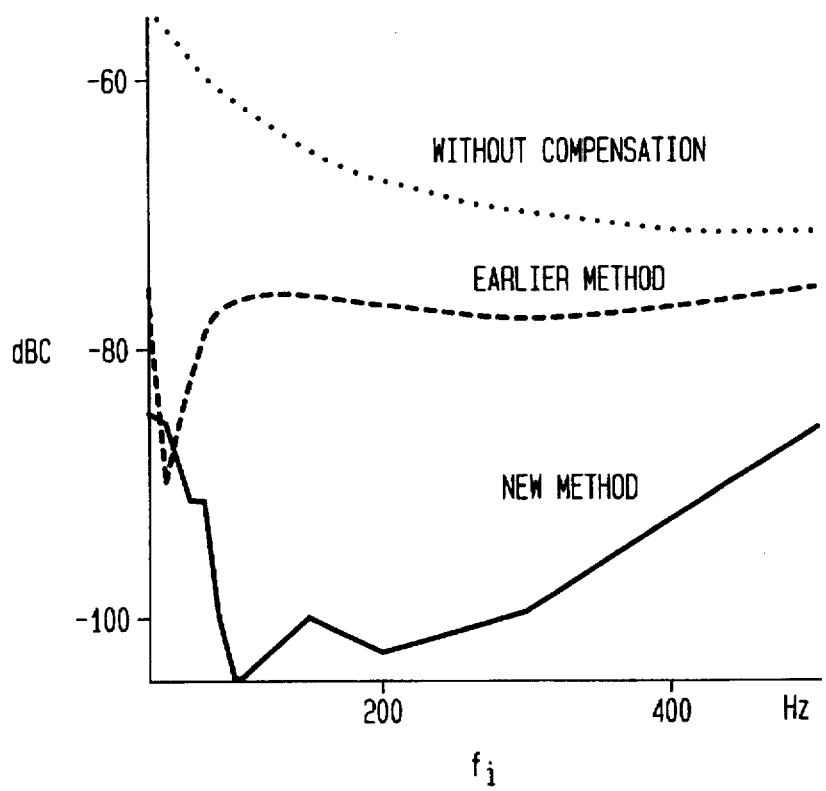
FIG. 9 is a chart comparing vibration-induced phase noises of a test oscillator.
Figure 10:
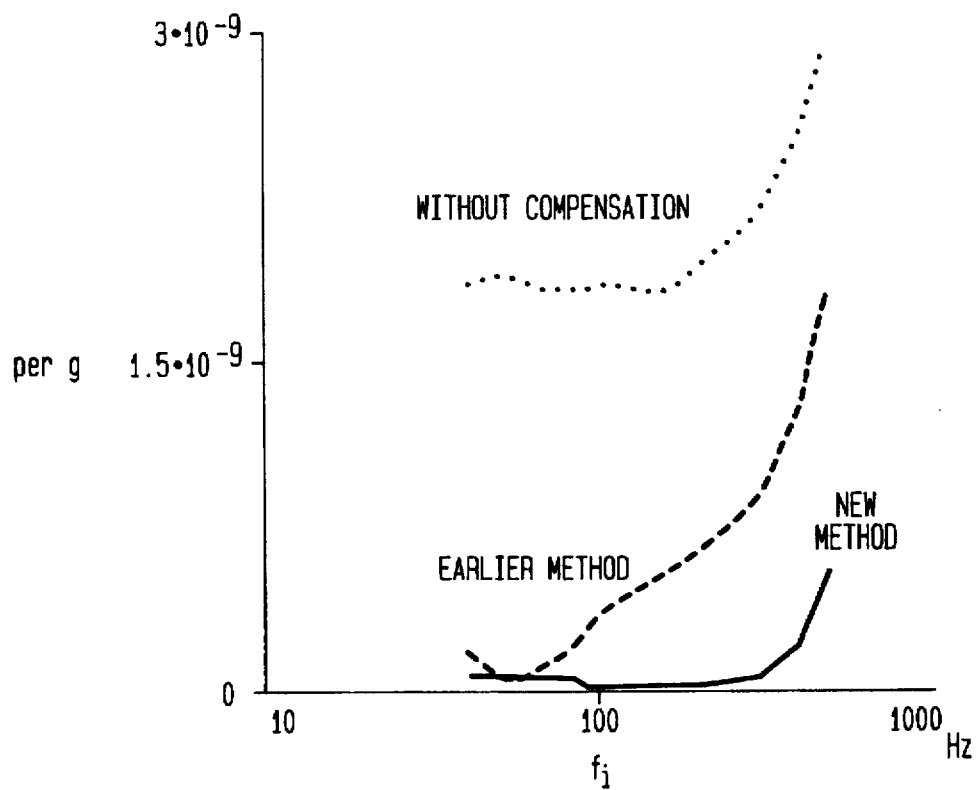
FIG. 10 is a chart comparing acceleration sensitivity of a test oscillator.

Referring to the lower solid curve in both FIGS. 9 and 10, it represents the vibration-induced phase noise after adaptive cancellation techniques are employed by adding an adaptive signal conditioner similar to the preferred embodiment of the present invention. As expected, when the magnitude and the phase curves of said adaptive signal conditioner fit well with the desired magnitude and desired phase values, between 50 Hz and 300 Hz as depicted in FIGS. 7 and 8, the vibration-induced noise was deeply suppressed from −30 dB to −43 dB, demonstrating that satisfactory vibration cancellation is achievable in varying frequencies. While the signal conditioner used in this comparative test of the FIG. 3 arrangement was implemented by using commercially available resistors, capacitors and operational amplifiers on a one square inch PC board, those skilled in the art will readily recognize the signal conditioner can be built into the VCXO and that numerous other sizes, shapes, analog elements and configurations of this device are considered to be within the contemplation of this present invention.

The present invention also discloses and claims an adaptive magnitude and phase compensated tuning method comprising a signal filtering step, a compensating step, a matching step and a vibration cancellation signal matching step. Using this method one can adjust the magnitude and phase of the output based on vibration frequency in order to match a vibration cancellation signal's frequency response to the frequency response of unwanted vibration-induced phase noise and to suppress vibration-induced phase noise.

Polarization-effect tuning methods need to tune magnitude, $A_v$, and the phase, $\theta_v$, of the applied voltage in order to satisfy cancellation conditions (i) and (ii) simultaneously. When vibration cancellation is required for varying vibration frequencies, f ∈ {$f_{low}$, $f_{high}$}, compensated tuning can adaptively adjust the tuning signal. As shown in FIG. 3, a signal conditioner 20, which adds the desired magnitude, *M(f), and the desired phase *P(f) to the tuning signal, when inserted into the tuning path satisfies cancellation conditions (i) and (ii) simultaneously over varying frequencies, where f ∈ {$f_{low}$, $f_{high}$}. FIG. 4 illustrates an identification device represented by the transfer functions, M(f) and P(f), which can be used during an adjusting step of the method of this invention to determine the transfer function, H(s) of FIG. 3 that provide the vibration cancellation signal needed to suppress vibration-induced phase noise.

Referring once again to FIG. 3, the adaptive magnitude and phase compensated tuning method of the present invention comprises the steps of connecting a means for sensing acceleration 21 to said signal conditioner 20, represented by the dashed rectangle on the drawing, said signal conditioner 20 further comprising a band filter 23 connected to a means for signal compensating 25, connecting a VCXO crystal oscillator 27 to said signal conditioner 20, a signal filtering step to send an output 22 to said compensating means 25, a compensating step where said compensating means 25 compensates the magnitude and phase characteristics of said output 22 by adding varying magnitude and phase to said output 22, an adjusting step where the magnitude, M(f), and phase, P(f), of said output 22 are adjusted to match a desired magnitude, M*(f) and desired phase, P*(f), of the output 22 and an adaptive tuning signal step where an adaptive tuning signal 26, including said desired magnitude, M*(f) and said desired phase, P*(f), matches the frequency response of vibration-induced phase noise. As a result, the cancellation signal cancels the vibration-induced phase noise. The adjusting step as depicted in FIG. 4 will be described in more detail below. Said adaptive tuning signal 26 is then sent to said VCXO crystal oscillator. In the method of the present invention said band filter 33 can be a wide-band filter that cuts off frequencies outside of the working range and cascades with a linear analog circuit within said compensating means 25. The adaptive magnitude and phase compensating tuning method of the present invention also encompasses using all analog circuits, including both the linear and non-linear type, and can be integrated with said VCXO. Said acceleration sensing means 21 can be any electrical or electronic device able to sense mechanical vibration, such as one or more accelerometers with three dimensional vibration compensation being provided when at least three accelerometers are utilized. Said band filter 23 can be a wide-band filter.

Referring now to FIG. 4, the adjusting step encompasses vibration-testing a second signal conditioner 50 to obtain the desired magnitude, M*(f), and the desired phase, P*(f), for said signal conditioner 20 in the laboratory by mounting a means for sensing acceleration, said second signal conditioner 50 and a test oscillator on a vibration platform 31. After mounting on the vibration platform 31, the method of the present invention further comprises the steps of connecting said means for sensing acceleration 32 to a band filter 33, a signal filtering step to provide an output 34 to a means for compensating magnitude and phase 35, providing a tuning signal 38 from said compensating means 35 to a test VCXO oscillator 39 and selecting a vibration frequency. During a vibrating step, a given mechanical vibration in a sinusoidal waveform, generated by said vibration table 31, vibrates said test VCXO oscillator 39, producing a frequency output including a plurality of vibration-induced noise waveforms 40, compensating said output 34 in said compensation means 35 by adjusting varying amounts of magnitude and phase to said output 34, sending a tuning signal 38 to said VCXO oscillator under test 39, feeding a VCXO output through a multiplier 46 to a phase lock loop 41, said VCXO output including a plurality of vibration-induced noise waveforms 40, observing said vibration-induced noise waveforms 40 on a spectrum analyzer 42 and providing an adjusted tuning signal 42 from said phase lock loop 40 to a vibration free VCXO oscillator 44, with an output of said vibration-free VCXO oscillator being fed to said multiplier.

In the measurement phase of the adjusting step, said compensating means 35 further comprises a means for phase adjustment 36, designated as P(f), coupled to a means for gain adjustment 37, designated as M(f), to provide said tuning signal 38 to said VCXO oscillator 39 under test. In FIG. 4, the components depicted outside the dashed rectangle are laboratory test devices for measuring the desired magnitude, M*(f), and desired phase, P*(f), of said compensating means 35 that are not needed for operations.

Figure 5:
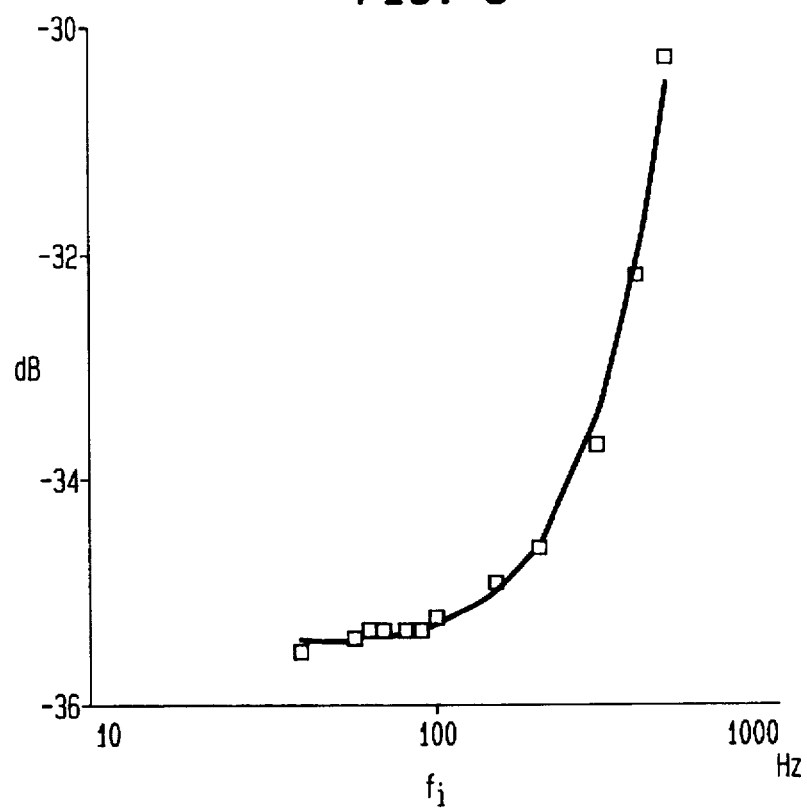
FIG. 5 is a chart depicting the magnitude curve of a fourth-order signal conditioner linear circuit matching the desired magnitude of the tuning signal vs. the vibration frequencies.

The FIG. 4 test arrangement can be utilized to identify the desired magnitude, M*(f), and the desired phase, P*(f), with the mechanical vibration generated by the vibration table. Said adjusting step further comprises measuring the desired magnitude, M*(f), and the desired phase, P*(f), by adjusting, alternatively, the means for gain adjustment 37 and the means for phase adjustment 36 of said output 34 until the plurality of vibration-induced noise waveforms 40 are no longer visible on the spectrum analyzer 41 by an adjustment means performed by an operator, an electrical device, a mechanical device or a computer program. At this point in the adjusting step, the magnitude of said gain adjustment means 37 is measured as the desired magnitude, M*(f), and the phase of said phase adjustment means 36 is measured as the desired phase, P*(f), at the vibration frequency, f. As shown in FIGS. 5 and 7, the squares represent the desired magnitude, M*(f), between a vibration frequency of 40–500 Hz, while in FIGS. 6 and *9 or 8, the squares represent desired phase, P*(f), between 40–500 Hz. The objective of the measurement portion of the method is to obtain the desired magnitude, M*(f), and the desired phase, P*(f), of the output or tuning signal, as the case may be, so that vibration-induced noise waveforms 40 will be canceled or eliminated in the FIG. 4 arrangements.

In operation, said compensating means 25 requires an analog circuit with the transfer function H(s) whose magnitude and phase match the desired magnitude and phase in a given vibration frequency range. Mathematically:

$$|H(f)| = M^*(f)$$
$$\angle H(f) = P^*(f)$$
$$f \in \{f_{low}, f_{high}\}$$

In this case, both conditions (i) and (ii) are satisfied, and the vibration-induced phase noise will be eliminated at f ∈ {$f_{low}$, $f_{high}$}.

The first matching approach starts with a second-order linear network, H(s), and assigning zeroes, and poles of H(s)

properly by using a computer program until both the magnitude curve and the phase curve of H(s) match the desired magnitude and the desired phase reasonably well. If a good match is not obtained, the operator should then increase the order of H(s) by one and repeat the matching process. Under this approach, the desired phase, P*(f), of FIG. 8, and the desired magnitude, M*(f), of FIG. 7 can be matched by:

$$H(f) = K \cdot \frac{\left(1+j\frac{f}{12}\right)\left(1+j\frac{f}{400}\right)}{\left(1+j\frac{f}{6}\right)\left(1+j\frac{f}{1260}\right)}$$

The second matching approach involves choosing a low order linear network L(s) for matching the desired magnitude and then using an all-pass filter P(s) to match the phase requirement so that finally, H(s)=L(s)P(s).

Figure 6:
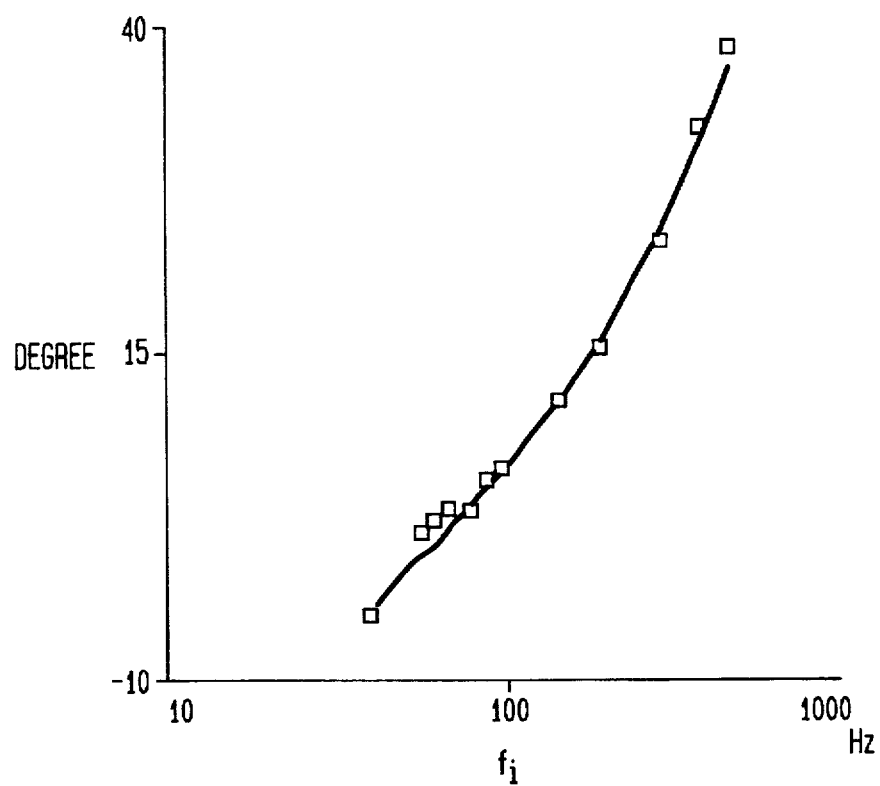
FIG. 6 is a chart depicting the phase curve of a fourth-order signal conditioner linear circuit matching the desired phase of the tuning signal vs. the vibration frequencies.

In the third matching approach, choosing a low order linear network L(s) to match the desired phase and then using a null-phased filter N(s) to match the magnitude requirement, so that H(s)=L(s)N(s). Under this approach, the desired phase, P*(f), of FIG. 6 can be matched by a second-order transfer function, according to the following transfer function:

$$L(f) = \frac{\left(1+j\frac{f}{6}\right)\left(1+j\frac{f}{600}\right)}{\left(1+j\frac{f}{0.1}\right)\left(1+j\frac{f}{11200}j\right)}$$

then, the desired magnitude, M*(f), of FIG. 5 can be matched by using L(f) together with a second-order transfer function, as follows:

$$N(f) = \frac{\left(1-j\frac{f}{820}\right)\left(1+j\frac{f}{820}\right)}{\left(1+j\frac{f}{1000000}\right)^2}$$

since N(s) has null phase for zeroes and has doubly large poles that are far away form the vibration frequency range of up to 500 MHz, the result is $\angle N(f) \approx 0$. As shown by FIGS. 5 and 6, the frequency responses of H(s)=L(s)N(s), which are represented by solid curves, fit both the desired magnitudes and the desired phases quite well. The FIGS. 9 and 10 charts illustrate that the magnitude and phase of the H(s) transfer function match the desired magnitudes and phases reasonably well. The three approaches discussed above are examples which are not intended to be the exclusive ways of determining the correct H(s) transfer function. Any approach which provides the transfer function H(s), with the |H(f)|≈M*(f) and ∠H(f)≈P*(f) will be valid and is considered to be within the scope of this disclosure and the appended claims.

What I claim is:

1. An adaptive signal conditioner for a crystal oscillator in a circuit subjected to a plurality of vibration sources, comprising:

a means for sensing acceleration providing an output to a band filter;

said band filter being connected to a means for compensating magnitude and phase, having a transfer function, H(s);

said output, having a magnitude, a phase, a given frequency and a given frequency response;

said band filter cutting off frequencies outside a predetermined working range;

said means for compensating magnitude and phase, having an analog circuit, being connected to said crystal oscillator;

said transfer function, H(s), having a desired magnitude, M*(f), and a desired phase, P*(f) to be determined;

an identification device, having a second signal conditioner with a second transfer function, M(f) and P(f) to identify said desired magnitude, M*(f), and said desired phase, P*(f);

said second signal conditioner further comprising a second means for compensating magnitude and phase, having a means for magnitude adjustment and a means for phase adjustment;

said identification device being vibrated to produce a vibration-induced phase noise;

said means for magnitude adjustment and said means for phase adjustment being adjusted to obtain said desired magnitude, M*(f), and said desired phase, P*(f);

adding said desired magnitude, M*(f), and said desired phase, P*(f) to a tuning signal of said signal conditioner to match said magnitude and said phase of the output; and said tuning signal, including a vibration cancellation signal, having a matching frequency response to match said given frequency response and suppressing said vibration-induced phase noise, being sent to said crystal oscillator.

2. The adaptive signal conditioner, as recited in claim 1, further comprising:

said band filter is a wide-band filter; and said crystal oscillator is a Voltage Controlled Crystal Oscillator (VCXO).

3. The adaptive signal conditioner, as recited in claim 2, wherein said means for sensing acceleration is at least three accelerometers.

4. The adaptive signal conditioner, as recited in claim 3, further comprising said wide-band filter cascading said analog circuit of the means for compensating magnitude and phase.

5. The adaptive signal conditioner, as recited in claim 1, wherein said analog circuit is linear.

6. The adaptive signal conditioner, as recited in claim 1, wherein said analog circuit is non-linear.

7. The adaptive signal conditioner, as recited in claim 3, wherein said means for sensing acceleration is an accelerometer.

8. The adaptive signal conditioner, as recited in claim 4, further comprising:

said matching frequency response being set during fabrication of said adaptive signal conditioner; and said plurality of vibration sources are mechanical vibration sources.

9. The adaptive signal conditioner, as recited in claim 3, further comprising said means for sensing acceleration providing three dimensional vibration compensation.

10. The adaptive signal conditioner, as recited in claim 4, further comprising integrating said signal conditioner said VCXO.

11. A method of adaptive magnitude and phase compensated tuning for a crystal oscillator in a circuit subjected to a plurality of vibration sources, comprising the steps of:

connecting said crystal oscillator, a means for sensing acceleration and a signal conditioner, said signal conditioner having a band filter and a means for compensating magnitude and phase;

connecting said means for sensing acceleration to said band filter;

said band filter signal filtering an output to said compensating means, said compensating means, having an analog circuit and a transfer function, H(s), being connected to said crystal oscillator;

said output having a magnitude, a phase, a given frequency and a given frequency response;

said transfer function, H(s), having a desired magnitude, *M(f), and a desired phase, *P(f), to be determined;

forming an identification device being connected to said crystal oscillator and said means for sensing acceleration, and having a second signal conditioner and a test VCXO oscillator on a vibration platform, said second signal conditioner having a second transfer function, M(f) and P(f), to identify said desired magnitude, *M(f), and said desired phase, *P(f);

said second signal conditioner further comprising a second means for compensating magnitude and phase, having a means for gain adjustment and a means for phase adjustment;

vibrating said identification device to initiate mechanical vibration in a sinusoidal waveform in said test VCXO oscillator, said sinusoidal waveform producing a frequency output including a vibration-induced phase noise, said frequency output and said vibration-induced phase noise being fed through a multiplier to a phase lock loop of said identification device;

measuring said vibration-induced noise on a spectrum analyzer, providing an adjusted tuning signal from said phase lock loop to a vibration-free VCXO oscillator producing an output of said vibration-free vibration-free VCXO oscillator fed to said multiplier;

adjusting said means for magnitude adjustment and said means for phase adjustment to obtain said desired magnitude, *M(f), and said desired phase, *P(f);

compensating said output in said compensating means of the signal conditioner by adding said desired magnitude, *M(f), and said desired phase, *P(f) to said output, forming a compensated output;

forming a tuning signal from said compensated output of said signal conditioner to match said magnitude and said phase of the output; and sending said tuning signal to said crystal oscillator, said tuning signal having a vibration cancellation signal with a matching frequency response to match said given frequency response and suppress said vibration-induced phase noise.

12. The method of adaptive magnitude and phase compensated tuning, as recited in claim 11 wherein said filter is a wide-band filter and said crystal oscillator is a Voltage Controlled Crystal Oscillator (VCXO).

13. The method of adaptive magnitude and phase compensated tuning, as recited in claim 12 wherein said means for sensing acceleration is at least three accelerometers.

14. The method of adaptive magnitude and phase compensated tuning, as recited in claim 13 further comprising said wide-band filter cascading said analog circuit of the means for compensating magnitude and phase.

15. The method of adaptive magnitude and phase compensated tuning, as recited in claim 14, wherein said analog circuit is linear.

16. The method of adaptive magnitude and phase compensated tuning, as recited in claim 14, wherein said analog circuit is non-linear.

17. The method of adaptive magnitude and phase compensated tuning, as recited in claim 13, wherein said means for sensing acceleration is an accelerometer.

18. The method of adaptive magnitude and phase compensated tuning, as recited in claim 14, wherein said adjusting step occurs during fabrication of said signal conditioner.

19. The method of adaptive magnitude and phase compensated tuning, as recited in claim 18, wherein:

during said adjusting step a data processing means matches a magnitude curve and a phase curve of said transfer function, H(s), to match said desired magnitude *M(f) and said desired phase *P(f) of the tuning signal; and said data processing means assigns zeroes and poles during said adjusting step.

20. The method of adaptive magnitude and phase compensated tuning, as recited in claim 18, wherein during said adjusting step said desired magnitude *M(f) of the tuning signal is matched before said desired phase *P(f).

21. The method of adaptive magnitude and phase compensated tuning, as recited in claim 18, wherein during said adjusting step said desired phase *P(f) of the adapted tuning signal is matched before said desired magnitude* M(f).

22. The method of adaptive magnitude and phase compensated tuning, as recited in claim 13, further comprising said means for sensing acceleration providing three dimensional vibration compensation.

23. The method of adaptive magnitude and phase compensated tuning, as recited in claim 14, further comprising integrating said signal conditioner into said VCXO.

\* \* \* \* \*